(12) United States Patent
Shimada et al.

(10) Patent No.: US 6,950,327 B2
(45) Date of Patent: Sep. 27, 2005

(54) SEMICONDUCTOR MEMORY DEVICE AND ELECTRONIC APPARATUS MOUNTING THE SAME

(75) Inventors: Yasuhiro Shimada, Kyoto (JP); Yoshihisa Kato, Shiga (JP); Takayoshi Yamada, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/686,583

(22) Filed: Oct. 17, 2003

(65) Prior Publication Data

US 2004/0081003 A1 Apr. 29, 2004

(30) Foreign Application Priority Data

Oct. 17, 2002 (JP) .......................................... 2002-302611

(51) Int. Cl.[7] .............................................. G11C 11/22
(52) U.S. Cl. ........................................ 365/145; 365/149
(58) Field of Search .................................. 365/145, 149

(56) References Cited

U.S. PATENT DOCUMENTS 5,835,400 A * 11/1998 Jeon et al. ................... 365/145
6,370,056 B1 * 4/2002 Chen et al. .................. 365/145
6,438,021 B2 * 8/2002 Kato ............................ 365/145
6,639,823 B2 * 10/2003 Hasegawa .................... 365/145

FOREIGN PATENT DOCUMENTS

JP          2930168        5/1999
JP        2000-293988     10/2000

* cited by examiner

*Primary Examiner*—Anh Phung
(74) *Attorney, Agent, or Firm*—McDermott Will & Emery LLP

(57) ABSTRACT

In a ferroelectric capacitor, two displacements (points b and c) of a remanent polarization correspond to data "1" and one displacement (point a) of the remanent polarization corresponds to data "0". When the data "1" is written, either of two electric voltage pulses different in potential or in pulse width is applied to the ferroelectric capacitor to position the displacement of the remanent polarization in the ferroelectric capacitor at the point b or at the point c. When the data "0" is written, on the other hand, the displacement of the remanent polarization in the ferroelectric capacitor is positioned at the point a.

11 Claims, 14 Drawing Sheets

SEMICONDUCTOR MEMORY DEVICE AND ELECTRONIC APPARATUS MOUNTING THE SAME

BACKGROUND OF THE INVENTION

The present invention relates to a semiconductor memory device for storing data by using a ferroelectric capacitor in a part of a memory cell and to an electronic apparatus mounting the semiconductor memory device.

As an example of a conventional semiconductor memory device having a memory cell composed of a ferroelectric capacitor and a transistor, there has been known one having a structure as shown in FIG. 10. As shown in FIG. 10, the memory cell of the semiconductor memory device has a ferroelectric capacitor 10 and a transistor 20. The ferroelectric capacitor 10 has a ferroelectric film composed of $SrBi_2Ta_2O_9$ with a thickness of 200 nm. The ferroelectric capacitor 10 has a first electrode 11 connected to the source 21 of the transistor 20 and a second electrode 12 connected to a cell plate line 31. The transistor 20 has a drain 22 connected to a bit line 32 and a gate electrode 23 connected to a word line 33.

In FIG. 10, 34 denotes a word line driver (WLD) for selecting the word line 33, 35 denotes a cell plate driver (CPD) for driving the cell plate line 31, 36 denotes a sense amplifier (SA) for differentially amplifying a voltage on the bit line 32, 37 denotes a reference voltage generator (RVG) necessary for the differential amplifying operation of the sense amplifier 46, and 38 denotes a bit line capacitance which is the capacitance of the bit line 32 represented by a circuit symbol.

In the following description, the one of polarizations induced upon the application of a voltage between the first and second electrodes 11 and 12 of the ferroelectric capacitor 10 which is observed in the ferroelectric capacitor 10 even after the applied voltage is removed will be termed a remanent polarization.

FIG. 11 shows the hysteresis loop y of the ferroelectric capacitor 10 when, after sets of data "1" and data "0" are written in the memory cell shown in FIG. 10, the operation of reading these data sets is performed. In the case of writing data in the memory cell shown in FIG. 10, if the charge accumulated in the first electrode 11 of the ferroelectric capacitor 10 has a negative polarity after the writing of the data, it is determined that the data "0" has been written by associating the displacement of the remanent polarization in the ferroelectric capacitor 10 with the point p in FIG. 11 and, if the charge accumulated in the first electrode 11 of the ferroelectric capacitor 10 has a positive polarity after the writing of the data, it is determined that the data "1" has been written by associating the displacement of the remanent polarization in the ferroelectric capacitor 10 with the point q in FIG. 11.

-Operation of Writing Data "1"-

FIG. 12A shows respective timings for potentials on the individual signal lines for writing the data "1" in the memory cell. Specifically, the potential on the word line 33 is raised from a L level to a H level at the time T1 so that the transistor 20 is turned ON. Then, at the time T2, the potential on the cell plate line 31 is raised to the H level, while the setting of the potential on the bit line 32 is kept at the L level, so that a potential difference (H–L) is produced in the ferroelectric capacitor 10 to orient the polarization in an upward direction and the data "1" is thereby written in the bit line 32. Even if the data "0" is written in the state prior to the writing of the data "1", i.e., if the polarization is facing downward, the (H–L) potential difference should have a value sufficiently exceeding a coercive voltage Vc necessary for polarization inversion in the ferroelectric capacitor 10 to ensure the rewriting of the data "0" to the data "1". If the ferroelectric film of the ferroelectric capacitor 10 is, e.g., a $SrBi_2Ta_2O_9$ film having a thickness of 200 nm, the coercive voltage of the ferroelectric capacitor 10 is about 1 V so that the foregoing requirement is fully satisfied if the potential difference (H–L) is 5 V.

-Operation of Writing Data "0"-

FIG. 12B shows respective timings for potentials on the individual signal lines for writing the data "0" in a memory cell. Specifically, the potential on the word line 33 is raised from a L level at, e.g., 0 V to a H level at, e.g., 5 V at the time T1 so that the transistor 20 is turned ON. Then, at the time T2, the potential on the cell plate line 31 is raised to the H level and the potential on the bit line 32 is also raised to the H level (data "0"). Thereafter, the potential on the cell plate line 31 is lowered to the L level at the time T3 so that a potential difference (H–L) is produced in the ferroelectric capacitor 10 to orient the polarization in the downward direction and the data "0" is thereby written in the bit line 32. Even if the data "1" is written in the state prior to the writing of the data "0", i.e., if the polarization is in the upward direction, the foregoing sequence of operations ensures the rewriting of the data "1" to the data "0".

-Operation of Reading Data "1"-

FIG. 13A shows respective timings for potentials on the individual signal lines in a read operation to the memory cell in which the data "1" has been written.

In reading the data, the potential on the bit line 32 is preliminarily lowered to the L level and then, at the time t1, the potential on the word line 33 is raised to the H level so that the transistor 20 is turned ON.

Then, at the time t2, the potential on the cell plate line 31 is raised to the H level. At this time, the bit line 32 is in the state connected to the sense amplifier 36 and retains the bit line capacitance 38. It follows therefore that a series capacitive coupling is formed by the cell plate line 31, the capacitance of the ferroelectric capacitor 10, the bit line capacitance 38, and the substrate. Consequently, the majority of the voltage applied to the cell plate line 31 is applied to the ferroelectric capacitor 10. The voltage is sufficiently higher than the coercive voltage Vc but the remanent polarization is upwardly deviated when the data "1" is written so that the bit line capacitance 38 is charged, while the deviated polarization undergoes a relatively small change. As a result, the potential on the bit line 32 at the time t3 is as low as 2 V at the maximum.

If the sense amplifier 36 is activated at the time t3 by setting, to 2.5 V, the signal inputted from the reference voltage generator 37 to the sense amplifier 36, the potential on the bit line 32 is lowered to the L level and it is determined that the potential on the bit line 32 is at the L level, i.e., that data "1" has been written.

At the time of reading the data "1", the remanent polarization in the ferroelectric capacitor 10 is not inverted so that the data in the memory cell is restored to the state before the read operation by lowering the potential on the cell plate line 31 to the L level at the time t4, lowering the potential on the bit line 32 to the L level at the time t5, and lowering the potential on the word line 33 to the L level at the time t6.

-Operation of Reading Data "0"-

FIG. 13B shows respective timings for potentials on the individual signal lines in a read operation to the memory cell in which the data "0" has been written.

In reading the data, the potential on the bit line 32 is preliminarily lowered to the L level and then, at the time t1, the potential on the word line 33 is raised to the H level so that the transistor 20 is turned ON.

Then, at the time t2, the potential on the cell plate line 31 is raised to the H level. At this time, the voltage applied to the cell plate line 31 is divided into a voltage applied to the ferroelectric capacitor 10 and a voltage applied to the bit line capacitance 38.

However, since the magnitude of the bit line capacitance 38 is about 5 to 10 times larger than the capacitance of the ferroelectric capacitor 10, the majority of the voltage applied to the cell plate line 31 is applied to the ferroelectric capacitor 10. Since the voltage is sufficiently higher than the coercive voltage Vc, the bit line capacitance 38 is charged, while the orientation of the polarization is inverted from the downward direction to the upward direction and the deviated polarization undergoes a relatively large change. This state will be understood from the movement of a point of intersection of the hysteresis loop y of the ferroelectric capacitor 10 and the read load line r for the data "0". At the time t3, the potential on the bit line 32 has been raised to about 3 V by the charging of the bit line capacitance 38.

In this state, if the sense amplifier 36 is activated at the time t3 by setting, to 2.5 V, the signal inputted from the reference voltage generator 37 to the sense amplifier 36, the potential on the bit line 32 is amplified to the H level and it is determined that the potential on the bit line 32 is at the H level, i.e., that data "0" has been written.

If the voltage on the bit line 32 is latched here, the data reading operation is completed. However, the remanent polarization in the ferroelectric capacitor 10 has been inverted from the downward direction to the upward direction, as described above. To restore the inverted state to the original state, a rewrite operation is performed. Specifically, the potential on the cell plate line 31 is lowered to the L level at the time t4 in FIG. 13B, while the setting of the potential on the bit line 32 is kept at the H level, whereby a potential difference (H–L) is produced between the bit line 32 and the cell plate line 31. By thus orienting the remanent polarization in the ferroelectric capacitor 10 to the downward direction again, the data "0" is written again. Thereafter, the potential on the bit line 32 is lowered to the L level at the time t5, while the potential on the word line 33 is lowered from the H level to the L level at the time t6.

By the foregoing operation, the memory cell holding the data "0" is restored to the state prior to the read operation.

Thus, in the conventional ferroelectric memory device, polarization inversion is necessary to rewrite the data held in the ferroelectric capacitor 10. Moreover, at least the operation of reading the data "0" from the memory cell cannot be performed unless the polarization in the ferroelectric capacitor 10 is inverted such that the bit line capacitance 38 having a magnitude 5 to 10 times larger than the capacitance of the ferroelectric capacitor 10 is charged. In short, the inversion of the remanent polarization is necessary in the data write operation and the data read operation.

However, since the phenomenon of polarization fatigue is observed in a ferroelectric film, the ferromagnetic film is degraded in the ability to exhibit distinct polarization if the operation of inverting the polarization is repeated.

If the writing or reading of data is repeatedly performed in the conventional ferroelectric memory device, the problem is encountered that the operating lifetime of the ferroelectric memory device is limited by the polarization fatigue of the ferroelectric film.

The polarization fatigue of the ferroelectric material can be recognized in, e.g., FIG. 14 in which the difference (hereinafter represented by 2Pr) between the magnitude of the remanent polarization when the data "0" is written and the magnitude of the remanent polarization when the data "1" is written gradually decreases with the repetitive application of a positive or negative voltage pulse. If the number of polarization inversions induced by the application of the positive or negative voltage pulse approaches $10^{10}$ times, the value 2Pr rapidly decreases.

The degree of the polarization fatigue in the ferroelectric film is dependent on the voltage of the voltage pulse. If it is assumed that the number of polarization inversions till the value 2Pr of a ferroelectric capacitor composed of $SrBi_2Ta_2O_9$ with a thickness of 200 nm decreases to 50% of the initial value is the rewritable number of times, the voltage dependence of the rewritable number of times as shown in FIG. 15 is obtained. That is, if the rewrite voltage is lowered, the polarization fatigue is suppressed and the rewritable number of times is increased exponentially.

As a method for suppressing the polarization fatigue of the ferroelectric film, e.g., the lowering of the rewrite voltage to a sufficiently low value can be considered. Specifically, if the rewrite voltage is lowered to 1.5 V or less in the case shown in FIG. 15, the rewritable number of times of $10^{15}$ or more is achievable.

In the ferroelectric capacitor, however, there is normally a voltage for performing the operation of writing data "1" or data "0" in the memory cell. If the write voltage is set to a low value which allows $10^{15}$ times or more rewrite operations, the displacement of the remanent polarization (in this case, the value 2Pr serves as an index) is rapidly reduced, which causes the following problem.

As shown in FIG. 16, the displacement of the remanent polarization depends on a data rewrite voltage. As shown in FIG. 17, the displacement of the remanent polarization depends on a data retention time so that it decreases with the lapse of the data retention time.

Therefore, the time during which data can be retained, i.e., the lifetime of the ferroelectric capacitor is determined based on the initial displacement of the remanent polarization. As can be seen from FIG. 17, e.g., a write voltage (which is 5 V in FIG. 16) which saturates the remanent polarization substantially completely is necessary for the initial displacement of the remanent polarization to provide a sufficiently long data retention lifetime (longer than $10^5$ hours).

To render the ferroelectric capacitor rewritable $10^{15}$ or more times, it is necessary to adjust the write voltage to 1.5 V or less. However, the initial displacement of the remanent polarization obtained with such a low write voltage is 10 $\mu C/cm^2$ at the maximum and the data retention lifetime expected therefrom is several hundred hours at the maximum.

Thus, in the conventional semiconductor memory device, it has been difficult to increase the rewritable number of times of the ferroelectric capacitor by using a lower write voltage and provide a sufficiently long data retention lifetime at the same time.

SUMMARY OF THE INVENTION

In view of the foregoing, it is therefore an object of the present invention to increase the rewritable number of times of a ferroelectric capacitor by using a lower write voltage and provide a sufficiently long data retention lifetime at the same time.

To attain the object, a semiconductor memory device according to the present invention comprises: a ferroelectric capacitor for storing any one of a plurality of logic values such that a plurality of different displacements of a remanent polarization correspond to at least one of said plurality of logic values, while another displacement of the remanent polarization different from each of the plurality of displacements of the remanent polarization corresponds to each of the plurality of logic values other than the at least one logic value; data writing means for applying, to the ferroelectric capacitor, at least one write electric voltage pulse for poling the ferroelectric capacitor in any one of the plurality of displacements and the other displacement and thereby writing any one of the plurality of logic values in the ferroelectric capacitor; and data reading means for applying a read electric voltage pulse to the ferroelectric capacitor, sensing the displacement of the remanent polarization in the ferroelectric capacitor when the read electric voltage pulse is applied, and thereby reading the logic value stored in the ferroelectric capacitor.

Since the plurality of different displacements of the remanent polarization correspond to one logic value in the ferroelectric capacitor of the semiconductor device according to the present invention, a write electric voltage pulse having a magnitude commensurate with the data retention time which is required after the writing of the data can be applied to the ferroelectric capacitor. This increases the rewritable number of times of the ferroelectric capacitor by using a lower write voltage, while imparting a sufficiently long lifetime to data retention at the same time.

In the semiconductor memory device according to the present invention, the write electric voltage pulse for poling the ferroelectric capacitor in any of the plurality of displacements preferably include a plurality of write electric voltage pulses different from each other in potential.

In the arrangement, the adjustment of the potential of the write electric voltage pulse allows a plurality of different displacements of the remanent polarization to be associated with one logic value.

In the semiconductor memory device according to the present invention, the write electric voltage pulses for poling the ferroelectric capacitor into any of the plurality of displacements preferably include a plurality of write electric voltage pulses different from each other in pulse width.

In the arrangement, the adjustment of the potential of the write electric voltage pulse allows a plurality of different displacements of the remanent polarization to be associated with one logic value.

In the semiconductor memory device according to the present invention, when the other displacement includes only one other displacement, the displacement is preferably zero or in the vicinity of zero and, when there the other displacement includes a plurality of other displacements, one of the plurality of displacements is preferably zero or in the vicinity of zero.

The arrangement facilitates the setting of a plurality of different displacements of the remanent polarization for one logic value.

In the semiconductor memory device according to the present invention, the read electric voltage pulse has preferably been set to a value such that, when the read electric voltage pulse is removed, the displacement of the remanent polarization in the ferroelectric capacitor is restored to the original displacement before the application of the read electric voltage pulse.

When the data (logic value) stored in the ferroelectric capacitor is read out, the arrangement prevents the read data from being destroyed so that the operation of rewriting data need not be performed. This obviates the necessity to perform the operation of changing the direction of polarization (polarization inverting operation) in the ferroelectric capacitor on each operation of reading data and renders the polarization fatigue less likely to occur.

Preferably, the semiconductor memory device according to the present invention further comprises: a capacitance load connected in series to the ferroelectric capacitor, wherein the data reading means preferably has means for applying the read electric voltage pulse to both ends of a series circuit composed of the ferroelectric capacitor and the capacitance load and the capacitance load has preferably been set to a value such that, when the read electric voltage pulse is removed, the displacement of the remanent polarization in the ferroelectric capacitor is restored to the displacement prior to the application of the read electric voltage pulse.

When the data (logic value) stored in the ferroelectric capacitor is read out, the arrangement prevents the read data from being destroyed so that the operation of rewriting data need not be performed. This obviates the necessity to perform the operation of changing the direction of polarization (polarization inverting operation) in the ferroelectric capacitor on each operation of reading data and renders the polarization fatigue less likely to occur.

In the semiconductor memory device according to the present invention, the data writing means preferably applies, during a normal operation, the write electric voltage pulse for poling the ferroelectric capacitor into the one of the plurality of displacements having a relatively small absolute value, while applying, in each specified cycle or immediately before a transition to a specified operating condition, the write electric voltage pulse for poling the ferroelectric capacitor into the one of the plurality of displacements having a relatively large absolute value.

The arrangement applies the electric voltage pulse for poling the ferroelectric capacitor in the one of the plurality of displacements having the relatively small absolute value during the normal operation so that the polarization fatigue of the ferroelectric capacitor is suppressed. On the other hand, the arrangement applies the write electric voltage pulse for poling the ferroelectric capacitor in the one of the plurality of displacements having the relatively large absolute value in each specified cycle or immediately before a transition to a specific operating condition so that a data retention time is elongated advantageously. This ensures an increase in the rewritable number of times of the ferroelectric capacitor and a sufficient data retention time.

If the data writing means applies different write electric voltage pulses during the normal operation and in each specified cycle or immediately before a transition to a specified operating condition, the semiconductor memory device according to the present invention preferably further comprises: a clock counter for counting clock pulses inputted from the outside or internally generated clock pulses; and control means for causing, based on a signal from the clock counter, the data writing means to apply the write electric voltage pulse for poling the ferroelectric capacitor in the one of the plurality of displacements having a relatively large absolute value in each specified cycle or immediately before a transition to a specified operating condition.

In the arrangement, the control means causes, in response to the signal from the clock counter, the data writing means to apply the write electric voltage pulse for poling the ferroelectric capacitor into the one of the plurality of displacements having the relatively large absolute value in each specified cycle or immediately before a transition to a specific operating condition. This ensures the application of the write electric voltage pulse for poling the ferroelectric capacitor in the one of the plurality of displacements having the relatively large absolute value.

A first electronic apparatus according to the present invention comprises: a semiconductor memory device comprising a ferroelectric capacitor for storing any one of a plurality of logic values such that a plurality of different displacements of a remanent polarization correspond to at least one of said plurality of logic values, while another displacement of the remanent polarization different from each of the plurality of displacements of the remanent polarization corresponds to each of the plurality of logic values other than the at least one logic value, data writing means for applying, to the ferroelectric capacitor, at least one write electric voltage pulse for poling the ferroelectric capacitor in any one of the plurality of displacements and thereby writing any one of the plurality of logic values in the ferroelectric capacitor, and data reading means for applying a read electric voltage pulse to the ferroelectric capacitor, sensing the displacement of the remanent polarization in the ferroelectric capacitor when the read electric voltage pulse is applied, and thereby reading the logic value stored in the ferroelectric capacitor, wherein the data writing means applies, during a normal operation, the write electric voltage pulse for poling the ferroelectric capacitor in the one of the plurality of displacements having a relatively small absolute value, while applying, in each specified cycle or immediately before a transition to a specified operating condition, the write electric voltage pulse for poling the ferroelectric capacitor in the one of the plurality of displacements having a relatively large absolute value; and a system control device for monitoring an operating state of a system and causing the data writing means to apply the write electric voltage pulse for poling in the ferroelectric capacitor into the one of the plurality of displacements having a relatively large absolute value in each specified cycle or immediately before a transition to a specified operating condition.

The first electronic apparatus according to the present invention applies the electric voltage pulse for poling the ferroelectric capacitor in the one of the plurality of displacements having the relatively small absolute value during the normal operation so that the polarization fatigue of the ferroelectric capacitor is suppressed. On the other hand, the arrangement applies the write electric voltage pulse for poling the ferroelectric capacitor in the one of the plurality of displacements having the relatively large absolute value in each specified cycle or immediately before a transition to a specific operating condition so that a data retention time is elongated advantageously. This ensures an increase in the rewritable number of times of the ferroelectric capacitor and a sufficient data retention time.

In addition, the system control device causes, in accordance with the operating state of the system, the data writing means to apply the write electric voltage pulse for poling the ferroelectric capacitor in the one of the plurality of displacements having the relatively large absolute value in each specified cycle or immediately before a transition to a specific operating condition. This ensures the application of the write electric voltage pulse for poling the ferroelectric capacitor in the one of the plurality of displacements having the relatively large absolute value.

A second electronic apparatus according to the present invention comprises: a semiconductor memory device comprising a ferroelectric capacitor for storing any one of a plurality of logic values such that a plurality of different displacements of a remanent polarization correspond to at least one of said plurality of logic values, while another displacement of the remanent polarization different from each of the plurality of displacements of the remanent polarization corresponds to each of the plurality of logic values other than the at least one logic value, data writing means for applying, to the ferroelectric capacitor, at least one write electric voltage pulse for poling the ferroelectric capacitor in any one of the plurality of displacements and thereby writing any one of the plurality of logic values in the ferroelectric capacitor, and data reading means for applying a read electric voltage pulse to the ferroelectric capacitor, sensing the displacement of the remanent polarization in the ferroelectric capacitor when the read electric voltage pulse is applied, and thereby reading the logic value stored in the ferroelectric capacitor, wherein the data writing means applies, during a normal operation, the write electric voltage pulse for poling the ferroelectric capacitor in the one of the plurality of displacements having a relatively small absolute value, while applying, in each specified cycle or immediately before a transition to a specified operating condition, the write electric voltage pulse for poling the ferroelectric capacitor in the one of the plurality of displacements having a relatively large absolute value; and a system control device for monitoring a power source for driving a system and causing the data writing means to apply the write electric voltage pulse for poling the ferroelectric capacitor in the one of the plurality of displacements having a relatively large absolute value immediately before a power supply from the power source is halted or immediately before the power source shifts to a power saving condition.

The second electronic apparatus according to the present invention applies the electric voltage pulse for poling the ferroelectric capacitor in the one of the plurality of displacements having the relatively small absolute value during the normal operation so that the polarization fatigue of the ferroelectric capacitor is suppressed. On the other hand, the arrangement applies the write electric voltage pulse for poling the ferroelectric capacitor in the one of the plurality of displacements having the relatively large absolute value in each specified cycle or immediately before a transition to a specific operating condition so that a data retention time is elongated advantageously. This ensures an increase in the rewritable number of times of the ferroelectric capacitor and a sufficient data retention time.

In addition, the system control device causes, in accordance with the operating state of the system, the data writing means to apply the write electric voltage pulse for poling the ferroelectric capacitor in the one of the plurality of displacements having the relatively large absolute value in each specified cycle or immediately before a transition to a specific operating condition. This ensures the application of the write electric voltage pulse for poling the ferroelectric capacitor in the one of the plurality of displacements having the relatively large absolute value.

In the second electronic apparatus according to the present invention, a primary battery or a secondary battery can be used as the power source.

DETAILED DESCRIPTION OF THE INVENTION

Embodiment 1

A semiconductor memory device according to a first embodiment of the present invention will be described herein below.

Figure 1:
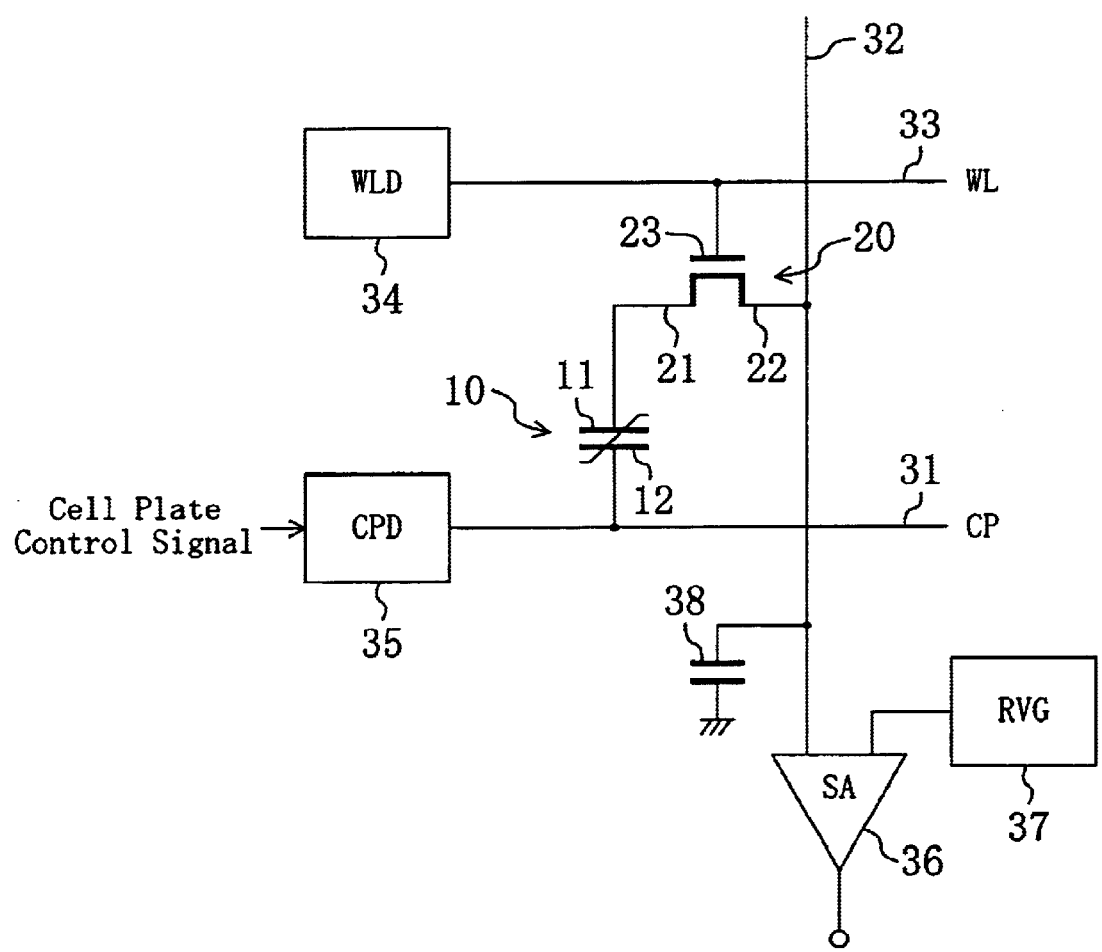
FIG. 1 is an equivalent circuit diagram showing the structure of a memory cell in a semiconductor memory device according to a first embodiment of the present invention.

FIG. 1 shows a memory cell composing the semiconductor device according to the first embodiment. As shown in FIG. 1, the memory cell has a ferroelectric capacitor 10 and a transistor 20. The ferroelectric capacitor 10 has a ferroelectric film composed of $SrBi_2Ta_2O_9$ with a thickness of 200 nm. The ferroelectric capacitor 10 has a first electrode 11 connected to the source 21 of the transistor 20 and a second electrode 12 connected to a cell plate line 31. The transistor 20 has a drain 22 connected to a bit line 32 and a gate electrode 23 connected to a word line 33.

In FIG. 1, 34 denotes a word line driver (WLD) for selecting the word line 33, 35 denotes a cell plate driver (CPD) for driving a cell plate line 31, and 36 denotes a sense amplifier (SA) for differentially amplifying a voltage on a bit line 32, 37 denotes a reference voltage generating circuit (RVG) necessary for the differential amplifying operation of the sense amplifier 36, and 38 denotes a bit line capacitance which is the capacitance of the bit line 32 represented by a circuit symbol.

Figure 10:
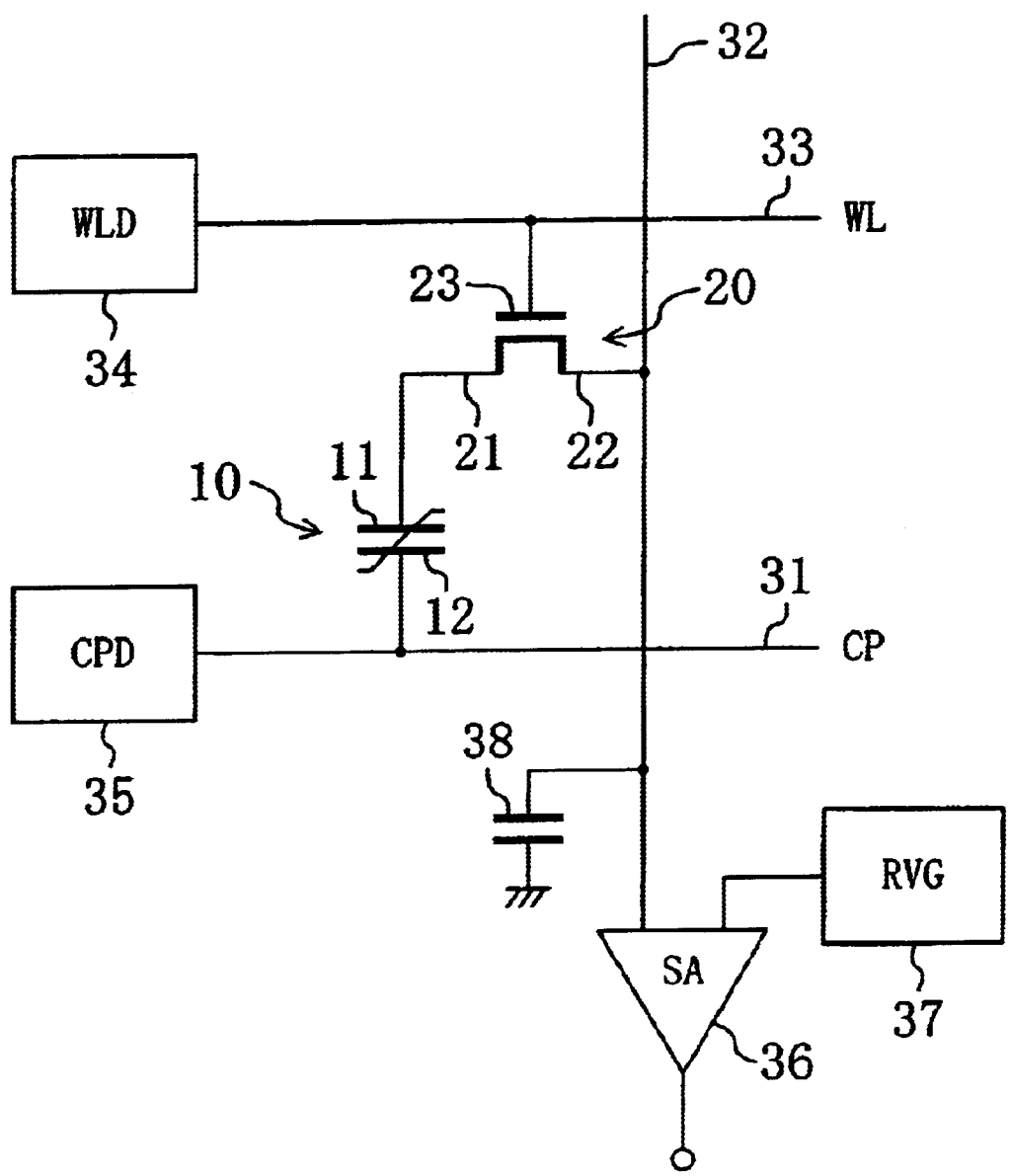
FIG. 10 is an equivalent circuit diagram showing the structure of a memory cell in a conventional semiconductor memory device.
Figure 11:
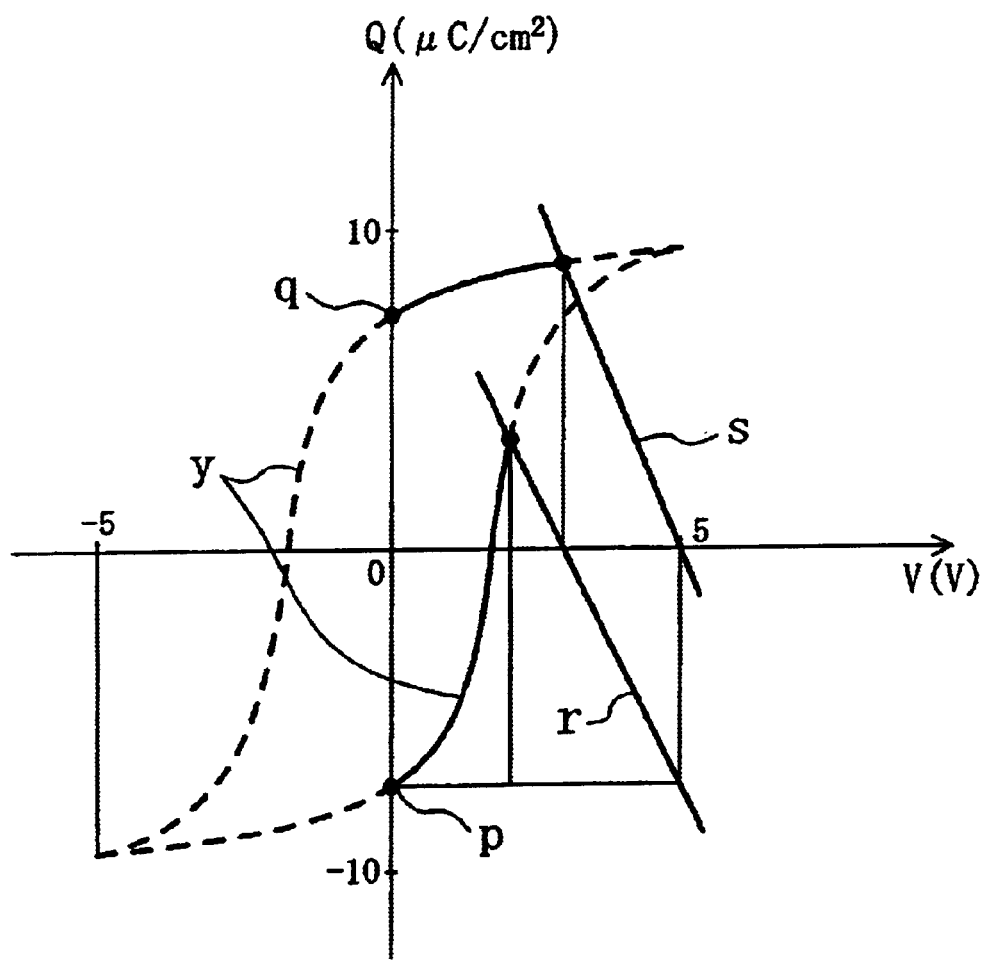
FIG. 11 shows working points on the hysteresis loop of a ferroelectric capacitor in the operations of writing data "1" and data "0" in a memory cell in the conventional semiconductor memory device and in the operation of reading the written data.
Figure 12A:
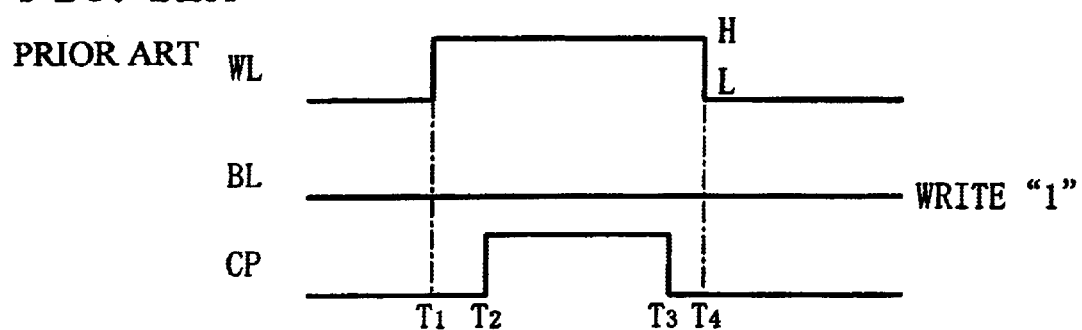
FIG. 12 shows a timing chart in the operations of writing data "1" and data "0" in a memory cell in the conventional semiconductor memory device.
Figure 12B:
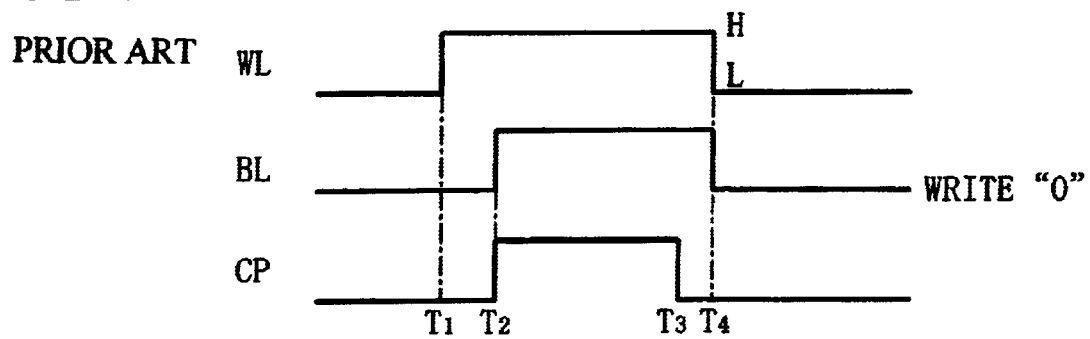
Figure 13A:
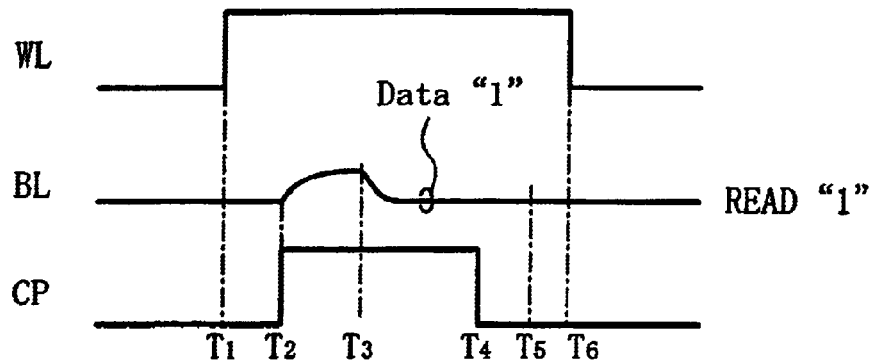
FIG. 13 shows a timing chart in the operations of reading the data "1" and the data "0" from the memory cell in the conventional semiconductor memory device.
Figure 13B:
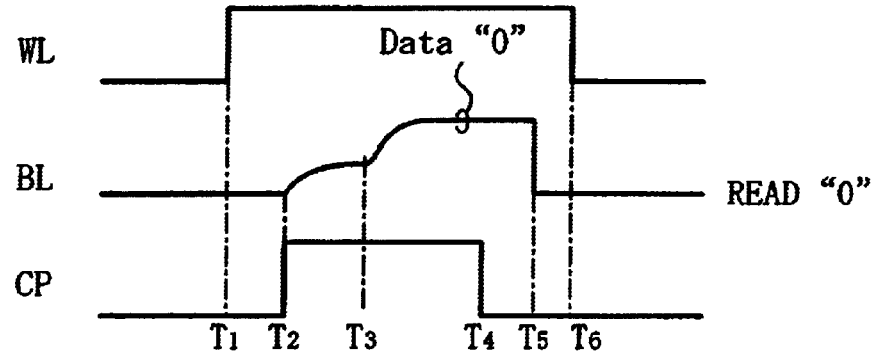
Figure 14:
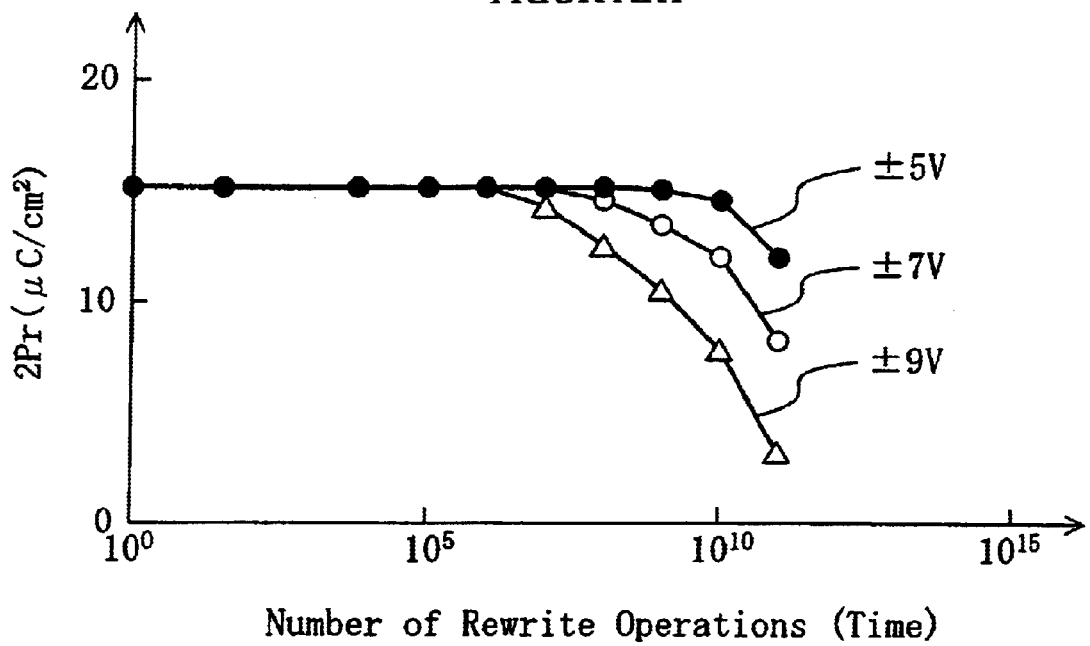
FIG. 14 shows the property of polarization fatigue of a ferroelectric capacitor composing a memory cell in the conventional semiconductor memory device.
Figure 15:
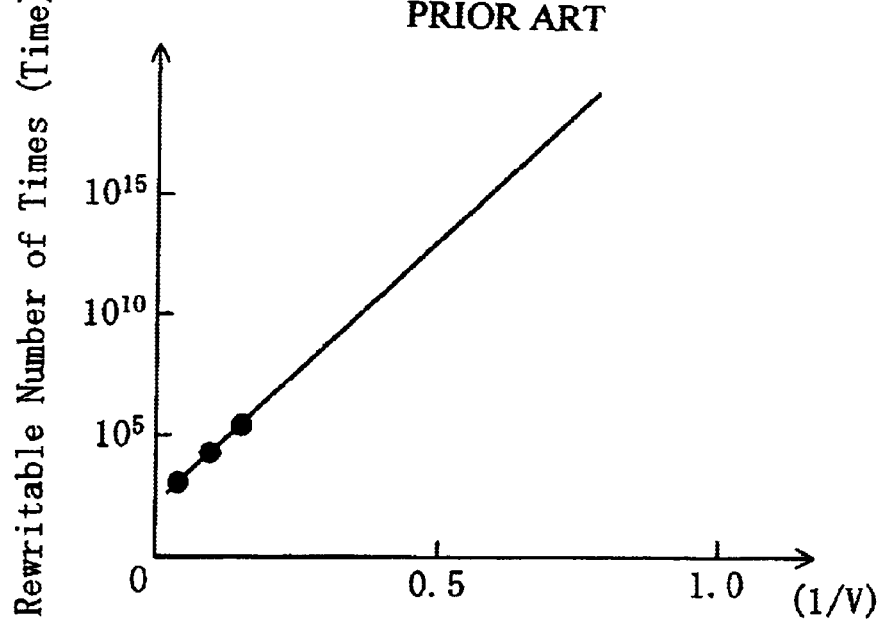
FIG. 15 illustrates the rewrite-voltage dependence of the rewritable number of times in the ferroelectric capacitor composing the memory cell in the conventional semiconductor memory device.
Figure 16:
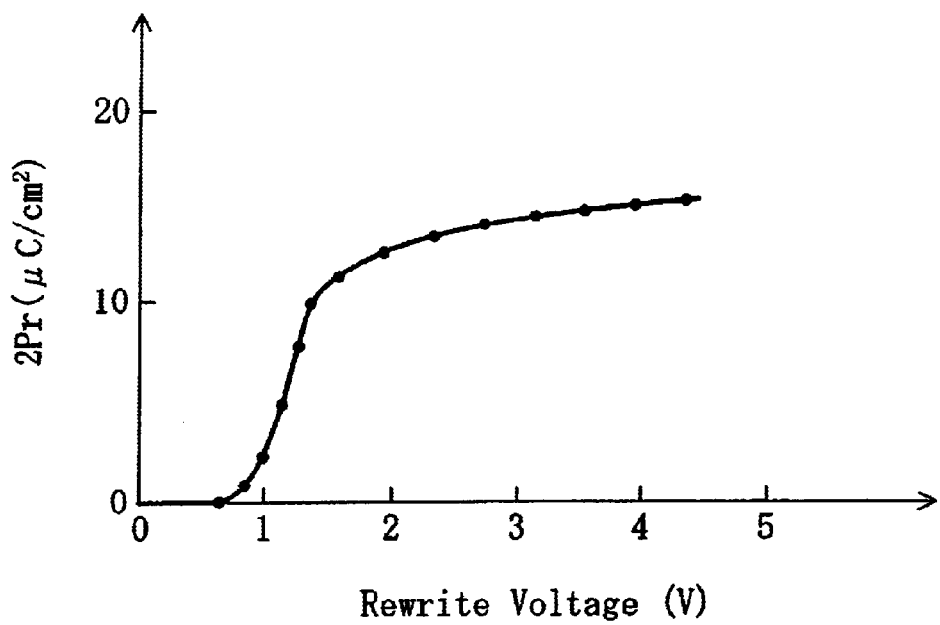
FIG. 16 illustrates the rewrite-voltage dependence of the displacement of a remanent polarization in the ferroelectric capacitor composing the memory cell in the conventional semiconductor memory device.
Figure 17:
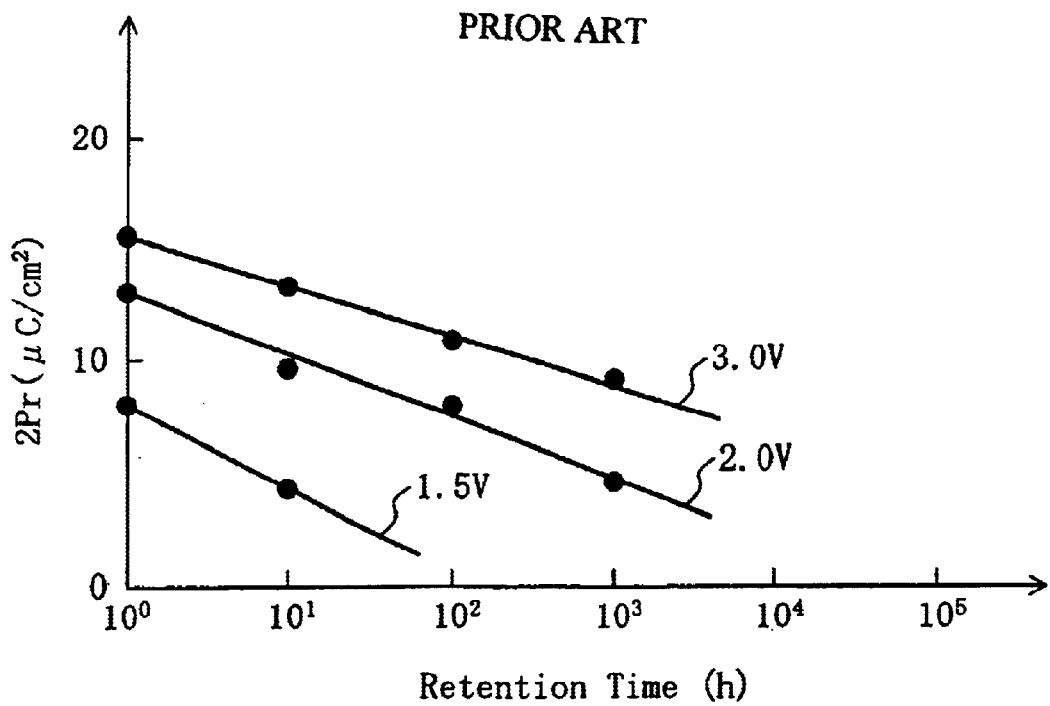
FIG. 17 illustrates the data-retention-time dependence of the displacement of the remanent polarization in the ferroelectric capacitor composing the memory cell in the conventional semiconductor memory device.

The semiconductor memory device according to the first embodiment is different from the conventional semiconductor memory device shown in FIG. 10 in the structure of the cell plate driver 35. Specifically, a cell plate control signal allows the respective magnitudes and widths of a write electric voltage pulse and a read electric voltage pulse generated by the cell plate driver 35 to be determined selectively.

Figure 2A:
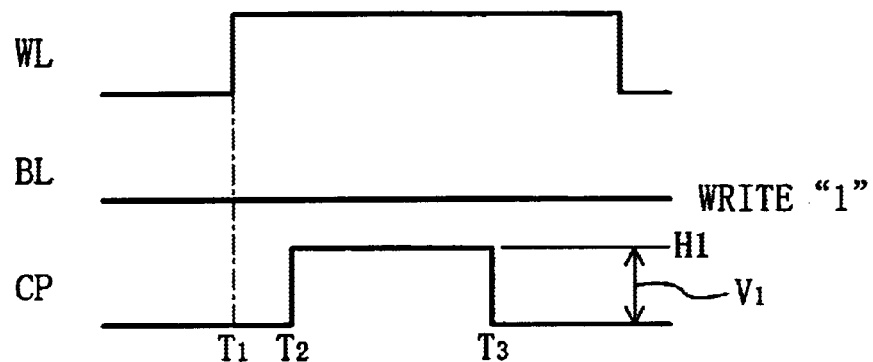
FIGS. 2A, 2B, and 2C show timing charts for electric voltage pulses in the operation of writing data "1" or data "0" in a memory cell in the semiconductor memory device according to the first embodiment.
Figure 2B:
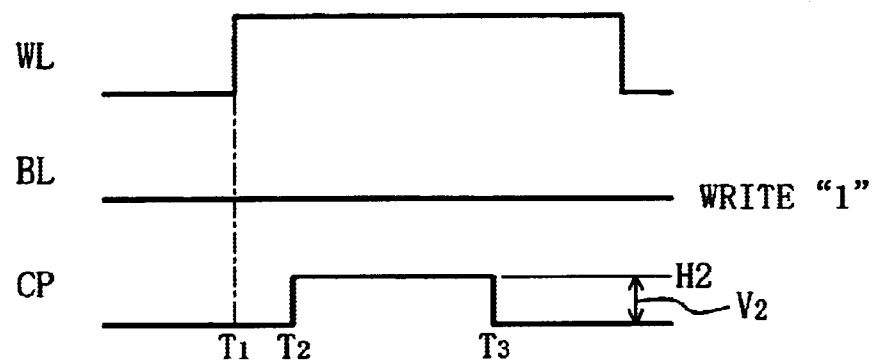
Figure 2C:
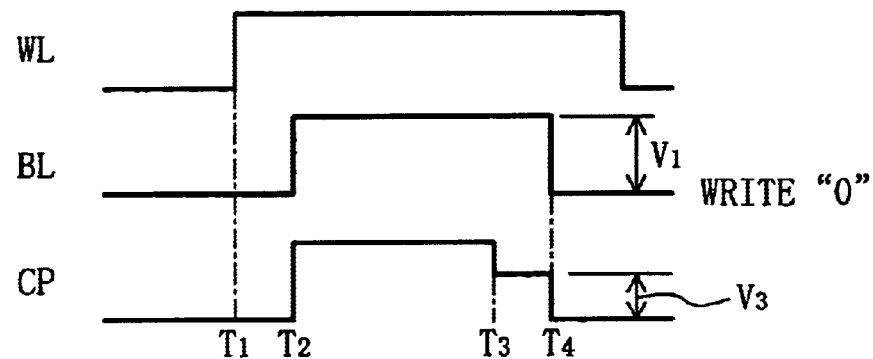

As shown in FIGS. 2A, 2B, and 2C, the cell plate driver 35 is capable of causing the cell plate line 31 to generate an electric voltage pulse at a desired potential, e.g., at a level V1, V2, or V3 and with a desired width which is, e.g., (T3–T2) or (T4–T3).

Since the plate control signal thus allows a selective combination of the potential of the electric voltage pulse applied to the cell plate line 31 with the width thereof, a plurality of logic values can be written in the ferroelectric capacitor 10 by using different electric voltage pulses and one of the plurality of logic values can be written therein by using different electric voltage pulses.

-Data Write Operation-

For example, it is possible to preliminarily associate data "1" with the plurality of displacements of a remanent polarization different from each other and thereby generate the plurality of displacements of remanent polarization corresponding to the data "1" by using different electric voltage pulses. A description will be given herein below to the operation with reference to the operational chart (FIG. 3) of the hysteresis loop of the ferroelectric capacitor 10.

If the initial displacement of the remanent polarization is positioned at the point a, the displacement of remanent polarization corresponding to the point b and the displacement of the remanent polarization corresponding to the point c are associated with the data "1".

To position the displacement in the ferroelectric capacitor 10 at the point c which corresponds to the one with a larger absolute value of the two displacements of the remanent polarization corresponding to the data "1", the potential on the cell plate line 31 is set to a H1 (power supply voltage) level, e.g., to the level of V1=3 V, while keeping the setting of the potential on the bit line 32 at the L level. This corresponds to the raising of the potential on the cell plate line 31 by the magnitude of V1 at the time T2 in FIG. 2A. At this time, the displacement of the remanent polarization moves from the point a to the point d via the point b. When the potential on the cell plate line 31 is removed thereafter at the time T3, the displacement of the remanent polarization moves from the point d to the point c so that the magnitude of the displacement of the remanent polarization at the point c is determined as the data "1".

To position the displacement of the ferroelectric capacitor 10 at the point b which corresponds to the one with a smaller absolute value of the two displacements of the remanent polarization corresponding to the data "1", the potential on the cell plate line 31 is set to a H2 level, e.g., to the level of V2=1.1 V, while keeping the setting of the potential on the bit line 32 at the L level. This corresponds to the raising of the potential on the cell plate line 31 by the magnitude of V2 at the time T2 in FIG. 2B. At this time, the displacement of the remanent polarization moves from the point a to the point e. When the potential on the cell plate line 31 is removed thereafter at the time T3, the displacement of the remanent polarization moves from the point e to the point b so that the magnitude of the displacement of the remanent polarization at the point b is determined as the data "1".

To position the displacement of the remanent polarization corresponding to the data "1" at the point c or the point b, it is also possible to set to the pulse width (T3–T2) of the electric voltage pulse to two different values and use the difference between the widths of the electric voltage pulses instead of using a method using the difference between the voltages of the electric voltage pulses as described above. The voltage magnitudes and widths of the electric voltage pulses can be determined selectively by using a cell plate control signal inputted to the cell plate driver 35.

On the other hand, the displacement of the remanent polarization in the ferroelectric capacitor 10 corresponding to the data "0" is associated with, e.g., only the point a at which the displacement of the remanent polarization is zero or in the vicinity of zero. To position the displacement of the remanent polarization at the point a, a potential difference or voltage having a polarity opposite to that of the electric voltage pulse used to write the data "1" and an absolute value slightly larger than that of the coercive voltage is applied appropriately to the ferroelectric capacitor 10. Specifically, each of the bit line 32 and the cell plate line 31 is placed at the same potential (=V1) and then only the potential on the cell plate line 31 is lowered by the magnitude of V3. Since the coercive voltage of the ferroelectric capacitor 10 is approximately 0.8 V in the present embodiment, if the level V3=2.1 V, the potential difference of −(V1−V3)=−0.9 V can be applied to the ferroelectric capacitor 10 during the period from the time T3 to the time T4. This allows the displacement of the remanent polarization corresponding to the data "0" to be positioned at the point f even if the displacement of the remanent polarization corresponding to the data "1" is at either the point c or the point b. When the potentials on the bit line 32 and on the cell plate line 31 are removed at the time T4 thereafter, the displacement of the remanent polarization settles at the point a corresponding to the data "0".

Thus, the cell plate control signal inputted to the cell plate driver 35 allows the displacement of the remanent polarization corresponding to the point c or the point b to be set for the data "1", while allowing the displacement of remanent polarization corresponding to the point a to be set for the data "0".

By thus associating the data "1" and the data "0" with the displacements of the remanent polarization which are asymmetrical relative to the point at which the remanent polarization is zero, the phenomena of the polarization fatigue and the imprinting of polarization to one direction, which are not preferable in terms of reliability, can be reduced.

-Data Read Operation-

Figure 4:
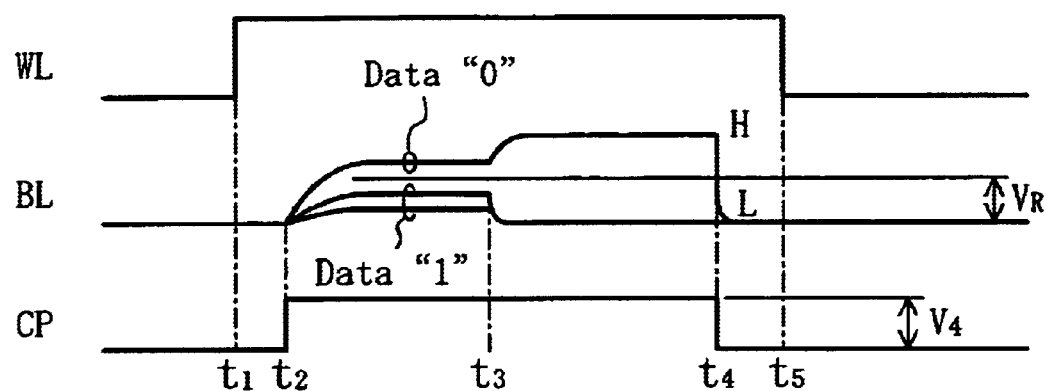
FIG. 4 shows a timing chart for electric voltage pulses in a read operation to a memory cell in the semiconductor memory device according to the first embodiment.

Timings for the respective potentials on the individual signal lines in the operation of reading the data thus written in the memory cell are as shown in, e.g., FIG. 4.

Specifically, the potential on the bit line 32 is preliminarily set at the L level and then, at the time t1, the potential on the word line 33 is raised to the H level so that the transistor 20 is turned ON. Then, at the time t2, the potential on the cell plate line 31 is raised by the magnitude of V4. At this time, the bit line 32 is in the state connected to the sense amplifier 36 and retains the bit line capacitance 38. It follows therefore that a series capacitive coupling is formed by the cell plate line 31, the ferroelectric capacitor 10, the bit line capacitance 38, and the substrate. Accordingly, the voltage applied to the cell plate line 31 is divided into a voltage applied to the ferroelectric capacitor 10 and a voltage applied to the bit line capacitance 38.

In this case, the voltage applied to the bit line capacitance 38 is subdivided into the following three levels depending on the displacement of the remanent polarization in the ferroelectric capacitor 10.

Figure 3:
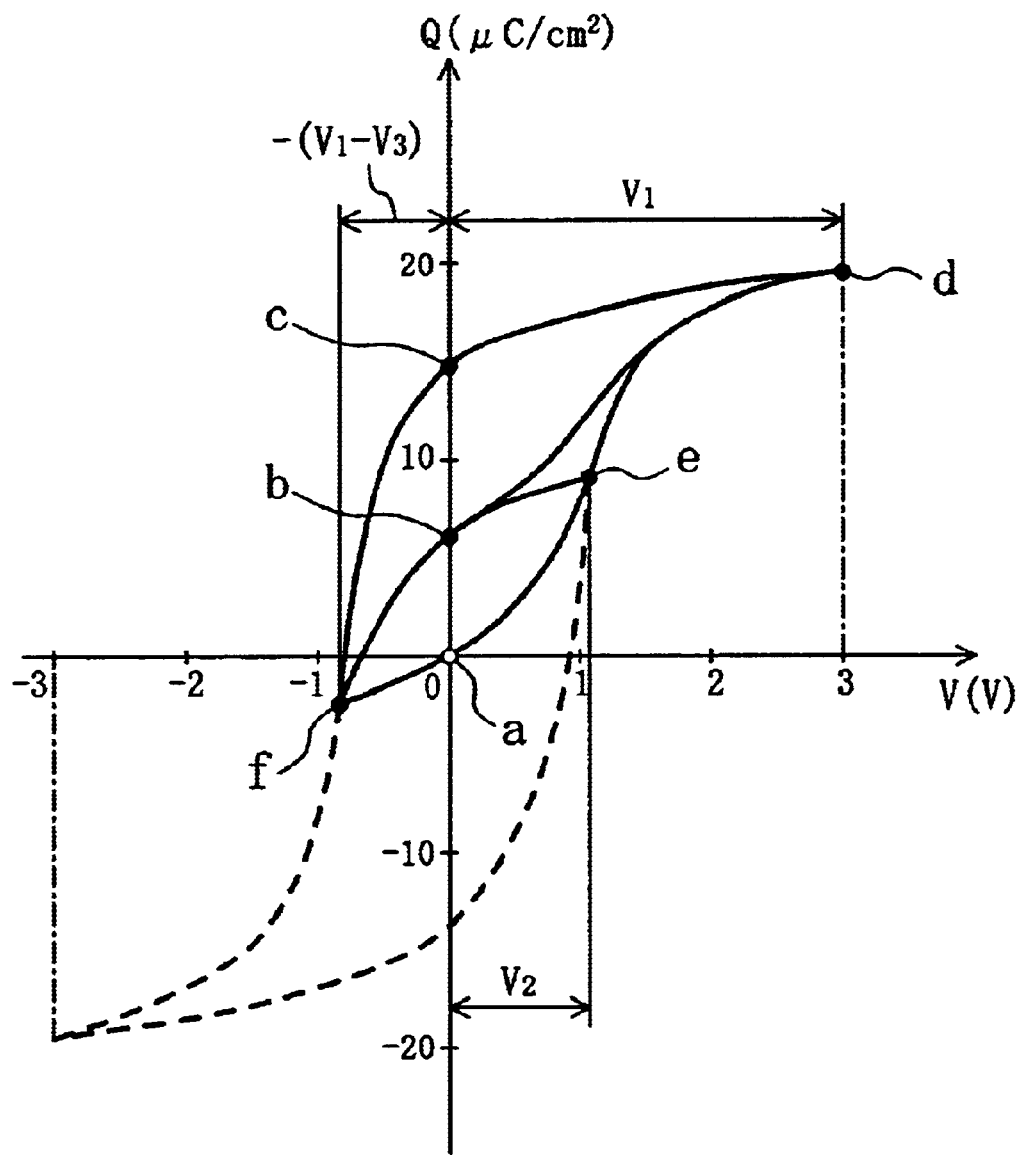
FIG. 3 shows working points on the hysteresis loops of a ferroelectric capacitor when either of the two displacements of a remanent polarization corresponding to the data "1" is written in a memory cell in the semiconductor memory device according to the first embodiment by using either of two different electric voltage pulses and when the displacement of the remanent polarization corresponding to data "0" is written in the memory cell.
Figure 5:
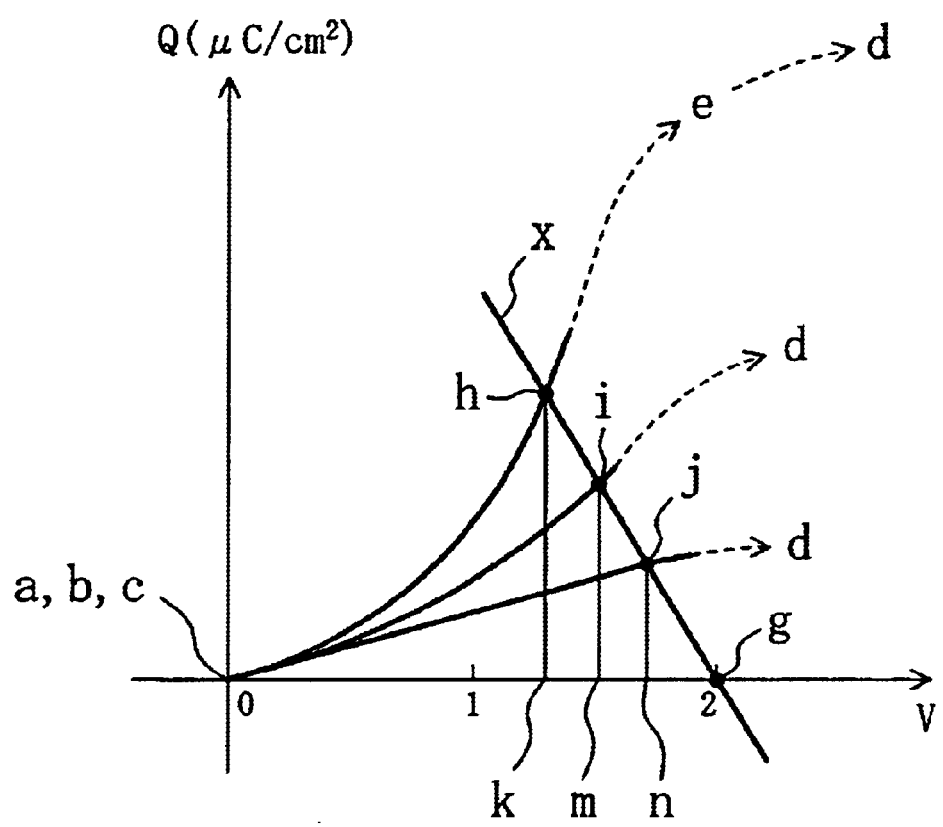
FIG. 5 illustrates a voltage applied to a bit line capacitance in the read operation to the memory cell in the semiconductor memory device according to the first embodiment.

In FIG. 5, x denotes a bit-line-capacitance load line determined based on the bit line capacitance 38. The points a, b, and c for the displacements of the remanent polarization shown in FIG. 3 are normalized to the origin of the orthogonal coordinates of the charge Q of the polarization and the voltage V If a read voltage at the level V4=2V is applied here to the cell plate line 31, i.e., to the series synthesized capacitance between the ferroelectric capacitor 10 and the bit line capacitance 38, the point of intersection of the bit-line-capacitance load line x and the V axis moves from the coordinate origin O to the point of 2V on the V axis (point g). At this time, the position of the point of intersection of the displacement of the polarization and the bit-line-capacitance load line x differs depending on whether the coordinate origin O lies at the point a, the point b, or the point c. Specifically, if the coordinate origin O lies at the point a (data "0"), the point of intersection is positioned at the point h. If the coordinate origin O lies at the point b (data "1"), the point of intersection is positioned at the point i. If the coordinate origin O lies at the point c (data "1"), the point of intersection is positioned at the point j. At this time, the potential on the bit line 32 has a value corresponding to the difference between the value at the point g (point of 2 V) and any of the values at the point k (about 1.3 V), the point m (about 1.6 V), and the point n (about 1.8 V) which are obtained by projecting the point h, the point i, and the point j onto the V axis. Accordingly, the potential on the bit line 32 corresponding to the point h (data "0") becomes about 0.7 V, the potential on the bit line 32 corresponding to the point i (data "1") becomes about 0.4 V, and the potential on the bit line 32 corresponding to the point j (data "1") becomes about 0.2 V.

When the potential of the signal from the reference voltage generator 37 inputted to the sense amplifier 36 is adjusted to RVG=0.5 V to 0.6 V and the sense amplifier 36 is activated at the time t3 in FIG. 4, the potential on the bit line 32 is amplified to the H level if the data "0" is stored or lowered to the L level if the data "1" is stored. This allows the determination of which one of the data "0" and the data "1" is stored. The result is latched as an output from the sense amplifier 36 by an external output circuit (not shown) and then the potential on the bit line 32 is lowered to the L level at the time t4.

If the data to be read is "0", the potential on the bit line 32 is at the H level (which is 3 V herein) at the time t3 in FIG. 4 and thereafter. As a result, a potential difference of about −1 V is produced between the bit line 32 at a potential of 3 V and the cell plate line 31 at a raised potential of 2 V so that the displacement of the remanent polarization is returned from the point g to the point f in FIG. 3. When each of the potentials on the bit line 32 and on the cell plate line 31 is lowered to the L level at the time t4, the displacement of the remanent polarization positioned at the point f is returned to the point a in the vicinity of the coordinate origin.

Thus, the value of the read voltage V4, the value of the power source voltage V1, and the value of the bit line capacitance 38 have been adjusted such that the displacement of the remanent polarization returns to the position prior to the read operation by the activation of the sense amplifier 36 and the removal of the voltages on the bit line 32 and on the cell plate line 31 at the time of reading the data "0". Specifically, the read electric voltage pulse applied to the ferroelectric capacitor 10 has been set to a value which returns the displacement of the remanent polarization in the ferroelectric capacitor 10 to the displacement prior to the application of the read electric voltage pulse upon the removal of the read electric voltage pulse irrespective of the operation of the sense amplifier 36 for electrically sensing a response from the ferroelectric capacitor 10 or the load capacitance connected in series to the ferroelectric capacitor 10 to convert a response from the ferroelectric capacitor 10 to an electric signal with the application of a read electric voltage pulse has been adjusted to a magnitude which returns the displacement of remanent polarization in the ferroelectric capacitor 10 to the displacement prior to the application of the read electric voltage pulse upon the removal of the read electric voltage pulse. Consequently, the operation of rewriting data becomes unnecessary or reduced for at least one of the plurality of logic values.

If the data to be read is "1", each of the potentials on the cell plate line 31 and on the bit line 32 is lowered to the L level at the time t4, while the potential on the word line 33 is lowered to the L level at the time t5, so that the data in the memory cell is restored to the state prior to the read operation. Briefly, the point i returns to the point b and the point j returns to the point c at the time t4.

According to the first embodiment, any one of two or more different levels is selected for the write electric voltage pulse for writing the data "1" and the respective displacements of the remanent polarization induced by the individual levels are different from each other. This allows the data retention lifetime after the rewriting of data to be adjusted with the displacements of remanent polarization corresponding to the different levels.

Although the first embodiment has described the read operation when 2 V (=V4) is set as the read voltage, the read voltage can be set to 1.5 V or less if the ratio of the capacitance of the ferroelectric capacitor 10 to the bit line capacitance 38 and the relationship between the read voltage V4 and the bit line capacitance 38 are adjusted. As a result, the voltage applied to the ferroelectric capacitor 10 can be suppressed to 1.5 V or less so that the readable number of times is increased exponentially.

Embodiment 2

An electronic apparatus according to a second embodiment of the present invention will be described herein below.

If the semiconductor memory device according to the first embodiment is mounted on a mobile electronic apparatus which operates with a rechargeable secondary battery, data once written should be retained over a long period of time when the power source of the mobile electronic apparatus is brought into a halted state or during the period during which the power source is disconnected from the electronic apparatus.

Accordingly, if a write operation is performed with a voltage which sufficiently elongates the retention period of a part or whole of written data immediately before the power source of the mobile electronic apparatus is halted or disconnected, a write voltage which allows the storage of data only during the period from the time the operation is initiated by turning on the power source till the power source is turned off is sufficient as the write voltage during the normal operation of the mobile electronic apparatus, i.e., while the power source is active (the state in which the power source is not halted or disconnected). The second embodiment is the electronic apparatus which embodies such an idea.

Figure 6:
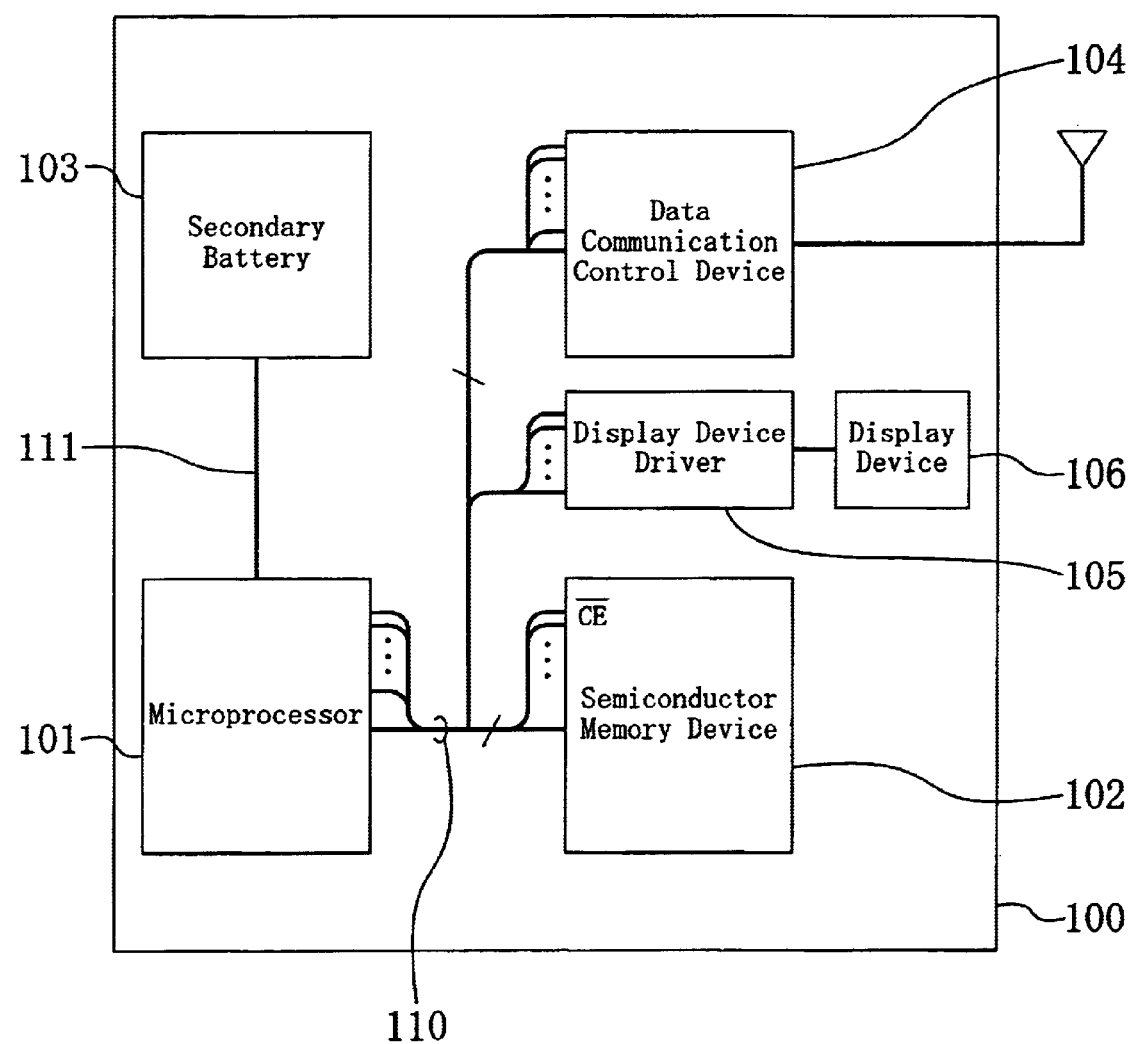
FIG. 6 is a block diagram showing an example of an electronic apparatus according to a second embodiment of the present invention.

FIG. 6 shows the overall structure of an electronic apparatus 100 according to the second embodiment. The electronic apparatus 100 comprises: a microprocessor 101; a semiconductor memory device 102; a secondary battery 103; a data communication control device 104; a display device driver 105; and a display device 106. The microprocessor 101, the semiconductor memory device 102, and the data communication control device 104 are connected to each other by a control/data bus 110, while the microprocessor 101 and the secondary battery 103 are connected to each other by a power supply monitor line 111.

The microprocessor 101 monitors whether or not the power of the secondary battery 103 is sufficient to drive the electronic apparatus 100 via the power supply monitor line 111. In short, the microprocessor 101 is means for monitoring the operating state of the system of the electronic apparatus 100.

Figure 7:
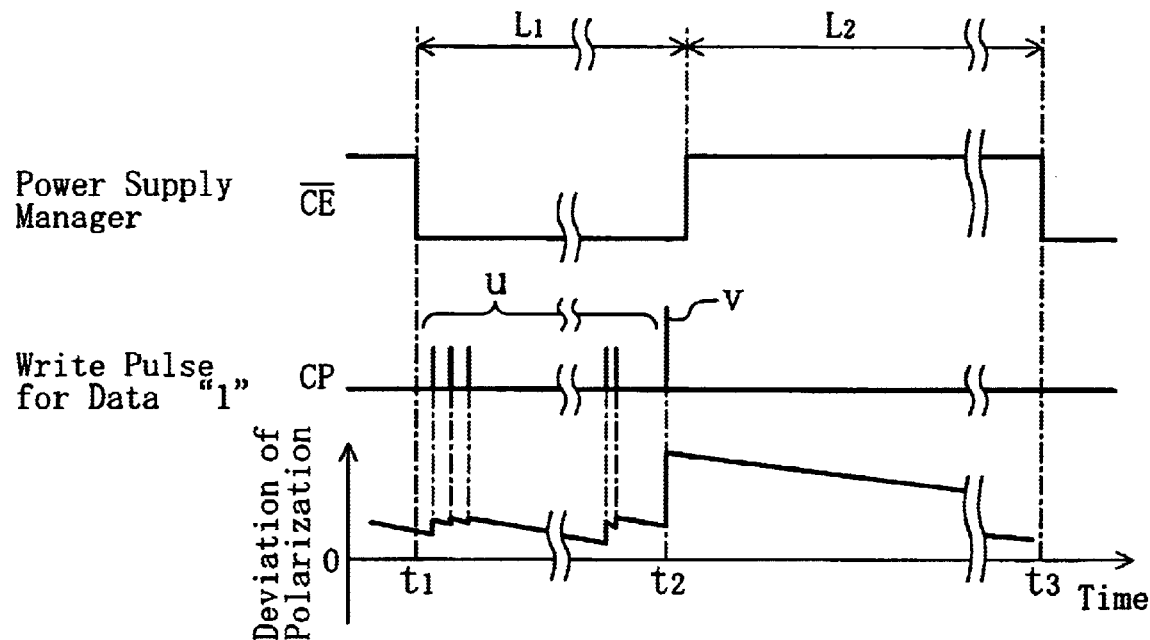
FIG. 7 shows a system operating state in the electronic apparatus according to the second embodiment and pulse trains for writing data "1" in a memory cell.

A time during which the secondary battery 103 is capable of supplying the power which can drive the electronic apparatus 100 is designated as L1. For example, the microprocessor 101 judges that the secondary battery 103 is incapable of supplying the power at the time τ2 at which the time L1 has elapsed from the time τ1 at which the secondary battery 103 started the supply of power and the driving of the electronic apparatus 100 was initiated, as shown in FIG. 7. The time period L1 during which the secondary battery 103 is capable of driving the electronic apparatus 100 having the display device 106 is in most cases several hours. During the time period L1, frequent access from the microprocessor 101 to the semiconductor memory device 102 is performed but the period lasts only for several hours at the maximum.

Figure 8:
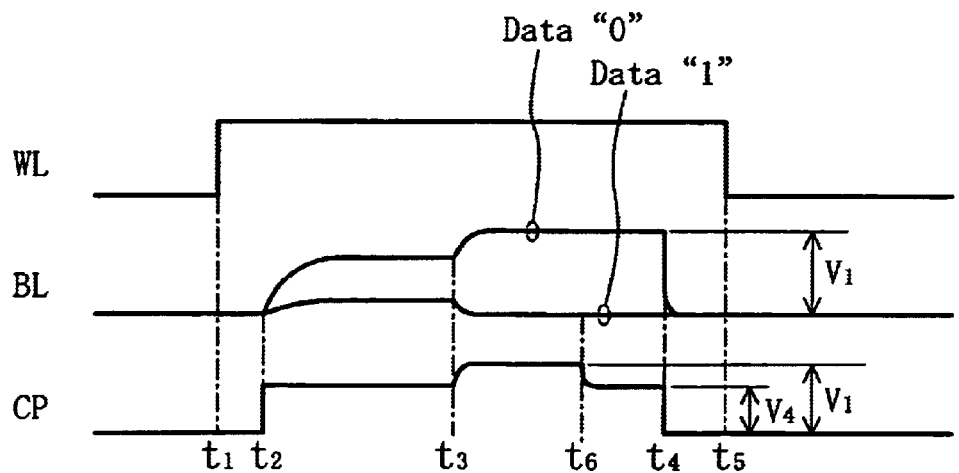
FIG. 8 shows a timing chart in the case where a rewrite operation is performed such that the displacement of a remanent polarization sufficiently large to retain data over a sufficiently long period of time is obtained after data is read from a memory cell in a semiconductor memory device composing the electronic apparatus according to the second embodiment.

In the semiconductor memory device 102 according to the second embodiment, the displacement of the remanent polarization in the ferroelectric capacitor 10 can be set to the one of two states corresponding to data "1" by using one of two different electric voltage pulses for the data "1" so that the operation of entirely rewriting desired data at the time τ2 immediately before the period L1 is terminated is performed. Since it is necessary to retain data for a sufficiently long period of time after the power source is halted, preferably for several years or longer, the data "1" which allows the remanent polarization to retain a large displacement over a long period of time should be written in the rewrite operation. The displacement of the remanent polarization for the rewritten data "1" corresponds to the point b in FIG. 3. The rewrite operation which allows the remanent polarization to have a large displacement is performed appropriately by reading the data onto the bit line 32 and then applying, for the data "1", the voltage at the high level V1 to the ferroelectric capacitor 10 during the period between the times t3 and t6, as shown in the timing chart of FIG. 8.

By thus performing the operation of entirely rewriting the desired data at the time τ2 immediately before the period L1 is terminated, the voltage for rewriting the data "1" in the semiconductor device 102 during the normal operation, i.e., during the period L1 need not be V1. A low voltage which positions the displacement of the remanent polarization at the point b in FIG. 3 is sufficient. In short, the voltage for rewriting the data "1" is sufficient if it has a magnitude which allows the displacement of the remanent polarization to be distinguished from that at the point f only during the period L1. Accordingly, it is sufficient to perform the operation of writing the data "1" during the period L1 by using the relatively low voltage V2 such that the displacement of the remanent polarization is positioned at the point b in FIG. 3.

As shown in FIG. 7, the period L1 is discerned with a /CE signal to the semiconductor memory device 102 in the electronic apparatus 100. Specifically, the /CE signal is at the L level during the period during which the secondary battery 103 is capable of supplying power which can drive the electronic apparatus 100.

Accordingly, data "1" is written with a pulse train u at a relatively low write voltage during the period. Although the displacement of the remanent polarization corresponding to the data "1" with the pulse train u attenuates with the lapse of time, it has a sufficient magnitude to allow distinction between the data "1" and data "0" at least at time τ2. If the data is read out at the time τ2 in accordance with the procedure shown in FIG. 8 and then a rewrite operation is performed during the period between the time t3 and the time t4, the displacement of the remanent polarization corresponding to the data "1" has a magnitude which allows the retention of the data during a sufficiently long time over the power supply halted period.

Figure 9:
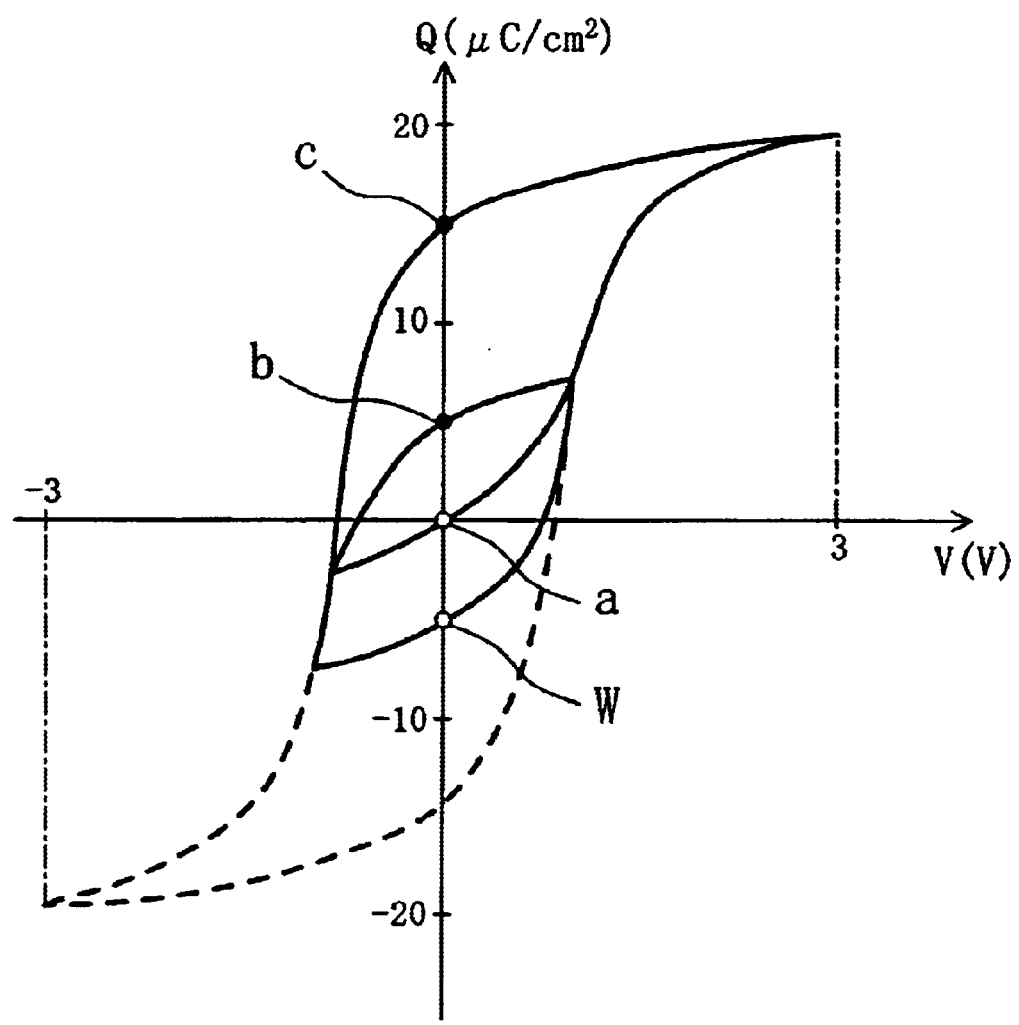
FIG. 9 shows working points on the hysteresis loops of a ferroelectric capacitor when a write operation is performed to a memory cell in the semiconductor memory device composing the electronic apparatus according to the second embodiment by using either of two different electric voltage pulses such that either of the two displacement of a remanent polarization corresponding to the data "1" is obtained and when a write operation is performed to the memory cell in the semiconductor memory device composing the electronic apparatus according to the second embodiment by using either of two different electric voltage pulses such that either of the two displacements of a remanent polarization corresponding to the data "0" is obtained.

Although the second embodiment has reduced the polarization fatigue by writing the data "1" at the point b and the data "0" at the point a during the period L1 and allowed data retention over a long period of time by writing the data "1" at the point c and the data "0" at the point a immediately before the period L1 is terminated, it is also possible to follow the procedure shown in FIG. 9 instead. That is, as shown in FIG. 9, the data "1" and the data "0" are written at the points b and w, respectively, during the period L1 and then the data "1" and the data "0" are written at the points c and a, respectively, immediately before the period L1 is terminated. The procedure not only allows a reduction in polarization fatigue and data retention over a long period of time but also implements a read operation with a reduced error by increasing the difference between respective read signals for the data "1" and the data "0" written during the period L1.

Although the power source for driving the electronic apparatus 100 is the rechargeable secondary battery in the second embodiment, a rechargeable primary battery may also be used instead.

Although the second embodiment has monitored the power source of the system of the electronic apparatus 100 and applied such an electric voltage pulse as to enlarge the displacement of the remanent polarization immediately before the power supply from the power source is halted or immediately before the power source shifts to a power saving condition, it is also possible to monitor the operating state of the system and apply such an electric voltage pulse as to enlarge the displacement of the remanent polarization in each specified cycle or immediately before a transition to a specified operating condition such as the halt of the power supply from the power source or to a power saving condition instead.

Instead of using the control device for monitoring the power source of the system or the control device for monitoring the operating state of the system, it is also possible to use an internal timer circuit and thereby count a clock pulse inputted from the outside or a self-generated clock pulse by using a clock counter and apply such an electric voltage pulse as to enlarge the displacement of the remanent polarization in each specified cycle or immediately before a transition to a specified operating condition based on a signal from the clock counter.

Since the plurality of different displacements of the remanent polarization correspond to one logic value in the ferroelectric capacitor of the semiconductor device according to the present invention, a write electric voltage pulse having a magnitude commensurate with the data retention time which is required after the writing of the data can be applied to the ferroelectric capacitor. This increases the rewritable number of times of the ferroelectric capacitor by using a lower write voltage, while imparting a sufficiently long lifetime to data retention at the same time.

What is claimed is:

1. A semiconductor memory device comprising:
   a ferroelectric capacitor for storing any one of a plurality of logic values such that a plurality of different displacements of a remanent polarization correspond to at least one of said plurality of logic values, while another displacement of the remanent polarization different from each of the plurality of displacements of the remanent polarization corresponds to each of the plurality of logic values other than the at least one logic value;
   data writing means for applying, to the ferroelectric capacitor, at least one write electric voltage pulse for poling the ferroelectric capacitor in any one of the plurality of displacements and the other displacement and thereby writing any one of the plurality of logic values in the ferroelectric capacitor; and
   data reading means for applying a read electric voltage pulse to the ferroelectric capacitor, sensing the displacement of the remanent polarization in the ferroelectric capacitor when the read electric voltage pulse is applied, and thereby reading the logic value stored in the ferroelectric capacitor.

2. The semiconductor memory device of claim 1, wherein the write electric voltage pulse for poling the ferroelectric capacitor in any of the plurality of displacements include a plurality of write electric voltage pulses different from each other in potential.

3. The semiconductor memory device of claim 1, wherein the write electric voltage pulses for poling the ferroelectric capacitor into any of the plurality of displacements include a plurality of write electric voltage pulses different from each other in pulse width.

4. The semiconductor memory device of claim 1, wherein, when the other displacement of the remanent polarization includes only one other displacement, the displacement is zero or in the vicinity of zero and, when the other displacement of the remanent polarization includes a plurality of other displacements, one of the plurality of displacements is zero or in the vicinity of zero.

5. The semiconductor memory device of claim 1, wherein the read electric voltage pulse has been set to a value such that, when the read electric voltage pulse is removed, the displacement of the remanent polarization in the ferroelectric capacitor is restored to the original displacement before the application of the read electric voltage pulse.

6. The semiconductor memory device of claim 1, further comprising:

a capacitance load connected in series to the ferroelectric capacitor, wherein the data reading means has means for applying the read electric voltage pulse to both ends of a series circuit composed of the ferroelectric capacitor and the capacitance load and the capacitance load has been set to a value such that, when the read electric voltage pulse is removed, the displacement of the remanent polarization in the ferroelectric capacitor is restored to the displacement prior to the application of the read electric voltage pulse.

7. The semiconductor memory device of claim 1, wherein the data writing means applies, during a normal operation, the write electric voltage pulse for poling the ferroelectric capacitor into the one of the plurality of displacements having a relatively small absolute value, while applying, in each specified cycle or immediately before a transition to a specified operating condition, the write electric voltage pulse for poling the ferroelectric capacitor into the one of the plurality of displacements having a relatively large absolute value.

8. The semiconductor memory device of claim 7, further comprising:

a clock counter for counting clock pulses inputted from the outside or internally generated clock pulses; and control means for causing, based on a signal from the clock counter, the data writing means to apply the write electric voltage pulse for poling the ferroelectric capacitor in the one of the plurality of displacements having a relatively large absolute value in each specified cycle or immediately before a transition to a specified operating condition.

9. An electronic apparatus, comprising:

the semiconductor memory device as recited in claim 7; and a system control device for monitoring an operating state of a system and causing the data writing means to apply the write electric voltage pulse for poling the ferroelectric capacitor into the one of the plurality of displacements having a relatively large absolute value in each specified cycle or immediately before a transition to a specified operating condition.

10. An electronic apparatus, comprising:

the semiconductor memory device as recited in claim 7; and a system control device for monitoring a power source for driving a system and causing the data writing means to apply the write electric voltage pulse for poling the ferroelectric capacitor into the one of the plurality of displacements having a relatively large absolute value immediately before a power supply from the power source is halted or immediately before the power source shifts to a power saving condition.

11. The electronic apparatus of claim 10, wherein the power source is a primary battery or a secondary battery.

* * * * *